United States Patent
Wang et al.

(10) Patent No.: US 9,985,601 B2
(45) Date of Patent: May 29, 2018

(54) STEP ATTENUATOR WITH CONSTANT INPUT CAPACITANCE

(71) Applicant: QUALCOMM Incorporated, San Diego, CA (US)

(72) Inventors: Xinwei Wang, Dunstable, MA (US); Xiangdong Zhang, Westford, MA (US); Marc Gerald Dicicco, Dunstable, MA (US)

(73) Assignee: QUALCOMM Incorporated, San Diego, CA (US)

(*) Notice: Subject to any disclaimer, the term of this patent is extended or adjusted under 35 U.S.C. 154(b) by 362 days.

(21) Appl. No.: 13/826,265

(22) Filed: Mar. 14, 2013

(65) Prior Publication Data
US 2014/0266518 A1 Sep. 18, 2014

Related U.S. Application Data

(60) Provisional application No. 61/654,633, filed on Jun. 1, 2012.

(51) Int. Cl.
*H01P 1/22* (2006.01)
*H03H 7/25* (2006.01)

(52) U.S. Cl.
CPC .............. *H03H 7/25* (2013.01); *H01P 1/22* (2013.01)

(58) Field of Classification Search
CPC ........................................................ H01P 1/22
(Continued)

(56) References Cited

U.S. PATENT DOCUMENTS

| 5,034,698 A | 7/1991 | Moriyasu |
| 6,344,780 B1 * | 2/2002 | Dobashi ............... H03H 11/245 333/17.3 |

(Continued)

FOREIGN PATENT DOCUMENTS

| CN | 201238286 Y | 5/2009 |
| FR | 2953342 A1 | 6/2011 |

(Continued)

OTHER PUBLICATIONS

Lee, et al., "A CMOS Mobile TV Tuner with Precise RF Gain Control and Fast Locking PLL for Multiband FM/T-DMB/DAB Applications," IEEE Radio and Wireless Symposium, 2011, pp. 251-254.

(Continued)

*Primary Examiner* — Stephen E Jones
(74) *Attorney, Agent, or Firm* — Patterson & Sheridan, L.L.P.

(57) ABSTRACT

A step attenuator with constant input capacitance and having good performance is disclosed. In an exemplary design, an apparatus includes a step attenuator having a constant input capacitance for different amounts of attenuation. The step attenuator receives an input signal, provides a variable amount of attenuation for the input signal, and provides an output signal. The step attenuator may include a plurality of attenuator sections coupled in series. Each attenuator section may include a plurality of capacitors and may have the constant input capacitance. At least one of the plurality of attenuator sections may be selected or unselected to obtain a selected amount of attenuation for the step attenuator. An attenuator section may provide a predetermined amount of attenuation or a variable amount of attenuation when selected. The apparatus may further include a power detector (Continued)

that receives and determines the power of the output signal from the step attenuator.

20 Claims, 8 Drawing Sheets

(58) Field of Classification Search
USPC .................................................. 333/81 R, 32
See application file for complete search history.

(56) References Cited

U.S. PATENT DOCUMENTS

| | | | |
|---|---|---|---|
| 7,184,731 B2 | 2/2007 | Kim | |
| 8,081,932 B2 | 12/2011 | Westra et al. | |
| 2007/0063788 A1* | 3/2007 | Zhu | H03H 7/38 333/32 |
| 2009/0134928 A1 | 5/2009 | Yamakawa | |
| 2009/0231069 A1 | 9/2009 | Mullen et al. | |
| 2011/0014886 A1 | 1/2011 | Manssen et al. | |
| 2014/0104132 A1* | 4/2014 | Bakalski | H03H 7/38 343/861 |

FOREIGN PATENT DOCUMENTS

| | | |
|---|---|---|
| JP | H04269005 A | 9/1992 |
| JP | 2003309454 A | 10/2003 |
| JP | 2010093710 A | 4/2010 |

OTHER PUBLICATIONS

Liu, et al., "Planning Reconfigurable Reactive Control for Voltage Stability Limited Power Systems," IEEE Transactions on Power Systems, May 2009, pp. 1029-1038, vol. 24, No. 2.
International Search Report and Written Opinion—PCT/US2013/043442—ISA/EPO—dated Oct. 2, 2013.
Kobayashi K.W., et al., "GAAS HBT Pin Diode Attenuators and Switches", IEEE MTT-S International Microwave Symposium Digest. Atlanta, Jun. 14-18, 1993; [IEEE MTT-S International Microwave Symposium Digest], New York, IEEE, US, vol. 1, Jun. 14, 1993 (Jun. 14, 1993), pp. 349-352, XP000436396.

* cited by examiner

STEP ATTENUATOR WITH CONSTANT INPUT CAPACITANCE

The present application claims priority to provisional U.S. Application Ser. No. 61/654,633, entitled "STEP ATTENUATOR WITH CONSTANT INPUT CAPACITANCE," filed Jun. 1, 2012, assigned to the assignee hereof and incorporated herein by reference in its entirety.

BACKGROUND

I. Field

The present disclosure relates generally to electronics, and more specifically to a step attenuator.

II. Background

An attenuator is a circuit that receives and attenuates/reduces an input signal and provides an output signal that is an attenuated/smaller version of the input signal. A step attenuator is an attenuator that provides a variable amount of attenuation, e.g., in discrete steps. A step attenuator may be designed to operate at radio frequency (RF) and may receive an input RF signal and provide an output RF signal. An RF step attenuator may be used for various electronics devices such as wireless communication devices. For example, an RF step attenuator may be used in a transmitter or a receiver to couple a portion of an RF signal to an RF power detector. The RF step attenuator can attenuate the RF signal, as necessary, so that an attenuated RF signal within a desired range of power levels is provided to the RF power detector. This may avoid damage to the RF power detector and may also improve the accuracy of power measurements from the RF power detector.

SUMMARY

A step attenuator with constant input capacitance and having good performance is disclosed herein. The constant input capacitance of the step attenuator, even with the step attenuator providing different amounts of attenuation, may result in the step attenuator having less impact on input matching of other circuits coupled to the step attenuator.

In an exemplary design, an apparatus includes a step attenuator having a constant input capacitance for different amounts of attenuation. The step attenuator receives an input signal, provides a variable amount of attenuation for the input signal, and provides an output signal. The apparatus may further include a power detector coupled to the step attenuator. The power detector may receive the output signal and determine the power of the output signal.

In an exemplary design, the step attenuator may include a plurality of attenuator sections coupled in series. Each attenuator section may include a plurality of capacitors and may have the constant input capacitance. At least one of the plurality of attenuator sections may be selected or unselected to obtain a selected amount of attenuation for the step attenuator. In general, each attenuator section may be a fixed attenuator section, or an adjustable attenuator section, or an always-selected attenuator section. A fixed attenuator section may provide a predetermined amount of attenuation when selected. An adjustable attenuator section may provide a variable amount of attenuation when selected. An always-selected attenuator section may provide a fixed or a variable amount of attenuation all the time.

In one design, each attenuator section may include a shunt capacitor, a series capacitor, and first and second switches. The shunt capacitor and the first switch may be coupled in series and between an input of the attenuator section and circuit ground. The series capacitor and the second switch may be coupled in parallel and between the input and output of the attenuator section. Capacitance values of the shunt capacitor and the series capacitor in each attenuator section may be selected to (i) provide a target amount of attenuation by the attenuator section when it is selected and (ii) provide the constant input capacitance regardless of whether the attenuator section is selected or unselected.

Various aspects and features of the disclosure are described in further detail below.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A step attenuator with constant input capacitance and having good performance are disclosed herein. The step attenuator may be used for various electronic devices such as wireless communication devices, personal digital assistants (PDAs), handheld devices, wireless modems, smartphones, laptop computers, smartbooks, netbooks, tablets, cordless phones, wireless local loop (WLL) stations, Bluetooth devices, consumer electronic devices, etc. For clarity, the use of the step attenuator for a wireless communication device is described below.

Figure 1:
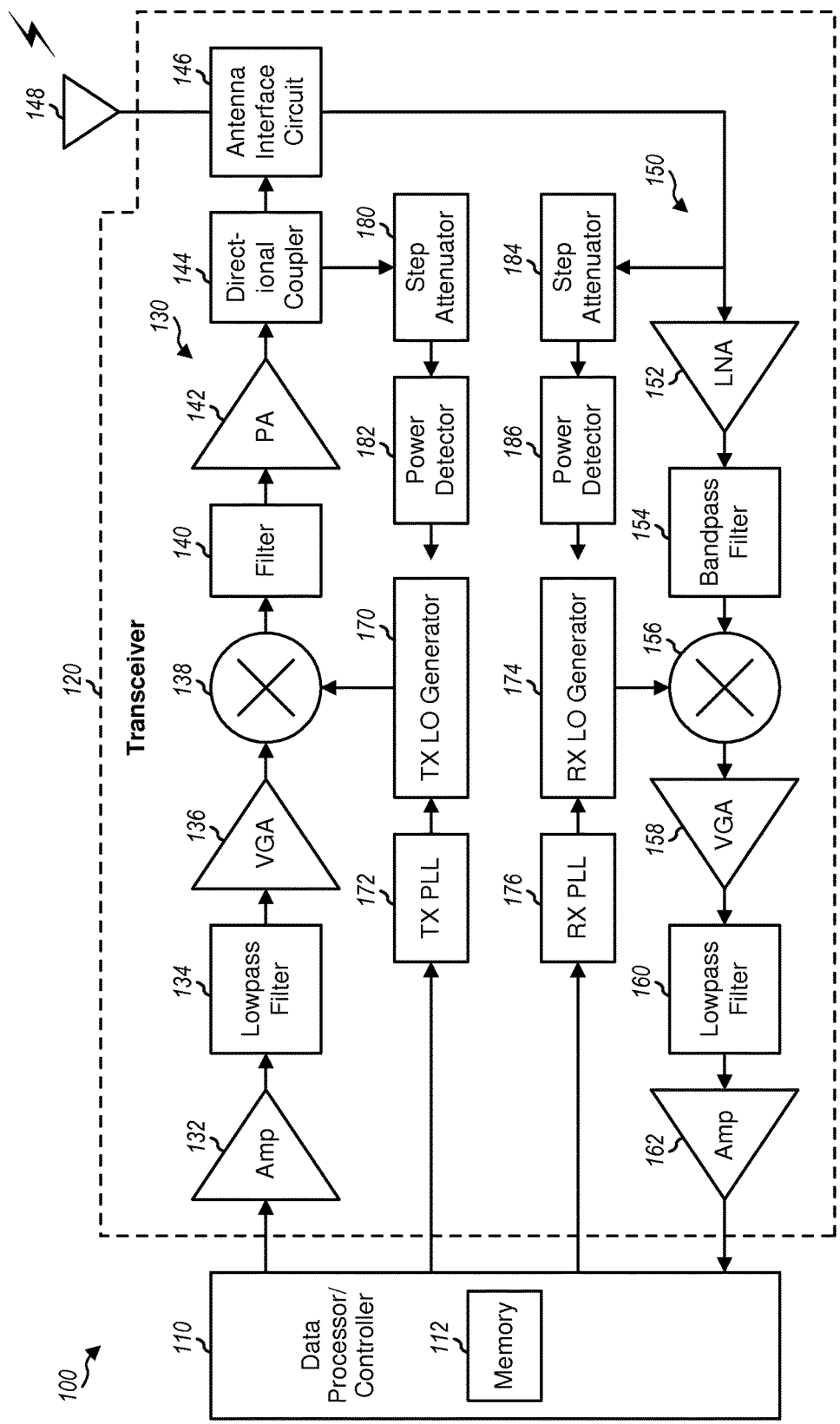
FIG. 1 shows a block diagram of a wireless communication device.

FIG. 1 shows a block diagram of an exemplary design of a wireless communication device 100. In this design, wireless device 100 includes a data processor/controller 110 and a transceiver 120 coupled to an antenna 148. Transceiver 120 includes a transmitter 130 and a receiver 150 that support bi-directional wireless communication. In general, wireless device 100 may include any number of transmitters and any number of receivers for any number of communication systems, any number of frequency bands, and any number of antennas.

In the transmit path, data processor 110 may process data to be transmitted and provide an analog output baseband signal to transmitter 130. Within transmitter 130, the analog output baseband signal may be amplified by an amplifier (Amp) 132, filtered by a lowpass filter 134 to remove images caused by digital-to-analog conversion, amplified by a variable gain amplifier (VGA) 136, and upconverted from baseband to RF by an upconverter 138. The upconverted signal may be filtered by a filter 140 and amplified by a power amplifier (PA) 142 to obtain a transmit RF signal having the proper output power level. The transmit RF signal may be routed through a directional coupler 144 and an antenna interface circuit 146 and transmitted via antenna 148.

In the receive path, antenna 148 may receive signals from base stations and/or other transmitter stations and may provide a received RF signal, which may be routed through antenna interface circuit 146 and provided to receiver 150. Within receiver 150, the received RF signal may be amplified by a low noise amplifier (LNA) 152, filtered by a bandpass filter 154, and downconverted from RF to baseband by a downconverter 156. The downconverted signal may be amplified by a VGA 158, filtered by a lowpass filter 160, and amplified by an amplifier 162 to obtain an analog input baseband signal, which may be provided to data processor 110.

A transmit (TX) LO generator 170 may generate a transmit LO signal for upconverter 138. A receive (RX) LO generator 174 may generate a receive LO signal for downconverter 156. Phase locked loops (PLLs) 172 and 176 may receive control information from data processor 110 and provide control signals to LO generators 170 and 174, respectively, to generate the transmit and receive LO signals at the proper frequencies.

A step attenuator 180 may receive one or more RF signals from directional coupler 144. For example, step attenuator 180 may receive an input RF signal at an input port, an output RF signal at an output port, a coupled RF signal at a coupled port, and/or a reflected RF signal at a reflected port of directional coupler 144. Step attenuator 180 may attenuate each RF signal and provide a corresponding attenuated RF signal to a power detector 182. Power detector 182 may measure the power of each attenuated RF signal received from step attenuator 180. A step attenuator 184 may receive a receiver input RF signals from antenna interface circuit 146 and provide an attenuated RF signal to a power detector 186. Step attenuator 184 may be coupled to the input of LNA 152 (as shown in FIG. 1), or an output of LNA 152 (not shown in FIG. 1), or some point in the receive path. Power detector 186 may measure the power of the attenuated RF signal received from step attenuator 184. The power measurements from power detector 182 and/or 186 may be used to control the operation of transceiver 120.

In general, a step attenuator and a power detector may make power measurements at any point in a transceiver. The power measurements may be used for various purposes such as to adjust the transmit power of a transmit RF signal, to determine an antenna impedance, to tune one or more matching networks (e.g., a matching network between PA 142 and antenna 148), etc FIG. 1 shows an exemplary design of transmitter 130 and receiver 150. In general, the conditioning of the signals in a transmitter and a receiver may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog ICs, RF ICs (RFICs), mixed-signal ICs, etc. For example, step attenuator 180 and/or 184 and power detector 182 and/or 186 may be implemented on an RFIC.

Data processor/controller 110 may perform various functions for wireless device 100, e.g., processing for data being transmitted and data being received by wireless device 100. A memory 112 may store program codes and data for data processor 110. Data processor/controller 110 may be implemented on one or more application specific integrated circuits (ASICs) and/or other ICs.

Figure 2:
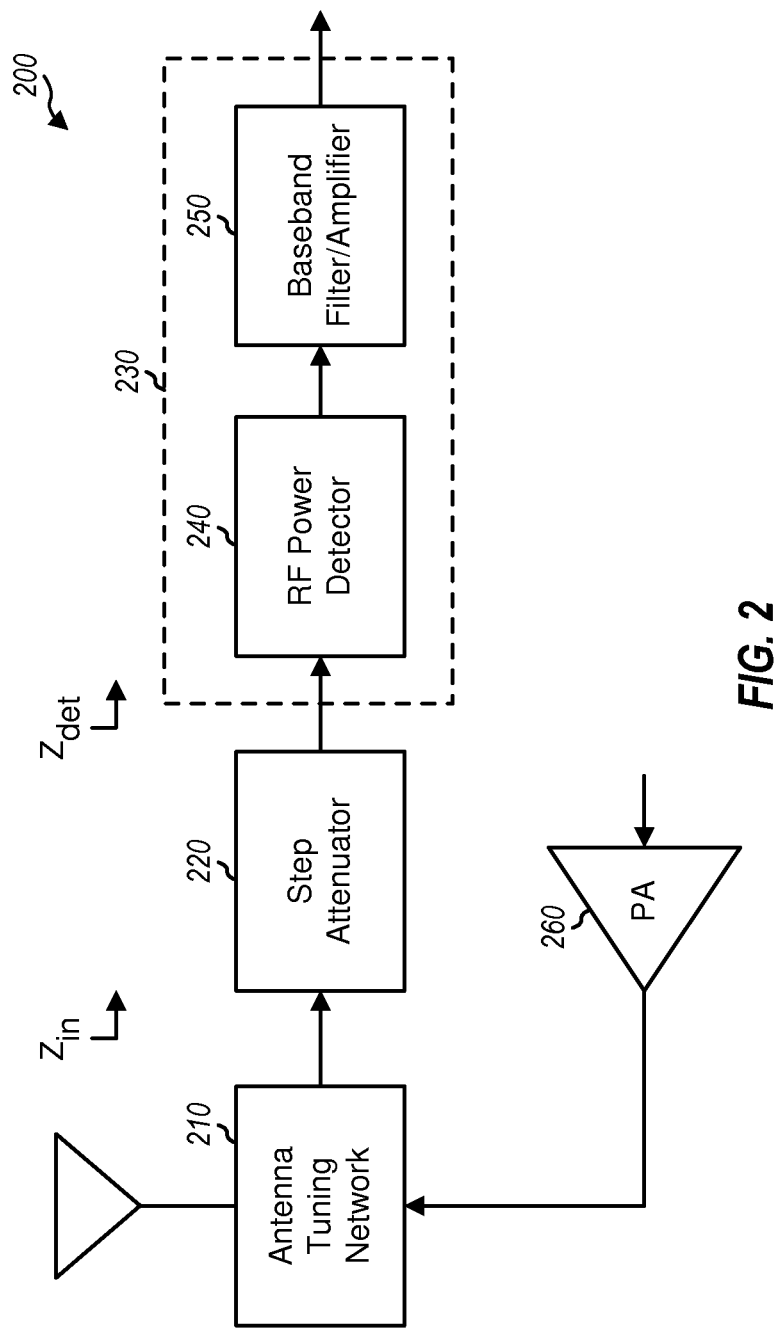
FIG. 2 shows a block diagram of an RF power measurement module.

FIG. 2 shows a block diagram of an exemplary design of an RF power measurement module 200. Module 200 includes a step attenuator 220 and a power detector 230. Power detector 230 includes an RF power detector 240 and a baseband filter/amplifier 250. Step attenuator 220 may correspond to step attenuator 180 or 184 in FIG. 1. Power detector 230 may correspond to power detector 182 or 186 in FIG. 1.

In the exemplary design shown in FIG. 2, an antenna tuning network 210 may receive a transmit RF signal from a PA 260 and may couple a portion of the transmit RF signal to step attenuator 220. Antenna tuning network 210 may be part of antenna interface circuit 146 in FIG. 1, and PA 260 may correspond to PA 142 in FIG. 1. In another exemplary design not shown in FIG. 2, a directional coupler may couple a portion of the transmit RF signal from PA 260 to step attenuator 220. In both designs, step attenuator 220 may receive an input RF signal comprising a portion of the transmit RF signal from PA 260. Step attenuator 220 may attenuate the input RF signal and provide an output RF signal to RF power detector 240. RF power detector 240 may detect the power of the output RF signal from step attenuator 220 and may provide an envelope signal indicative of the power of the output RF signal. Filter/amplifier 250 may filter and amplify the envelope signal and provide a power detector output signal.

As shown in FIG. 2, RF power detector 240 may have an input impedance of $Z_{det}$, which may be largely determined by an input capacitance of $C_{det}$ of RF power detector 240, or $Z_{det} \approx X_{det}$, where $$X_{det} = \frac{1}{j\omega \cdot C_{det}}$$

is the reactance due to the input capacitance of RF power detector 240. As also shown in FIG. 2, step attenuator 220 may have an input impedance of $Z_{in}$, which may be largely determined by an input capacitance of $C_{in}$ of step attenuator 220, or $Z_{in} \approx X_{in}$, where $$X_{in} = \frac{1}{j\omega \cdot C_{in}}$$

is the reactance due to the input capacitance of step attenuator 220.

Step attenuator 220 may be designed such that its input capacitance is approximately equal to the input capacitance of RF power detector 240, or $C_{in} \approx C_{det}$. This would result in step attenuator 220 having negligible impact on input matching between antenna tuning network 210 and RF power detector 240. Step attenuator 220 may also be designed such that its input capacitance is approximately constant versus attenuation, or $C_{in} \approx C_{det}$ for different amounts of attenuation provided by step attenuator 220. This would result in step attenuator 220 having negligible impact on input matching between antenna tuning network 210 and RF power detector 240 for different amounts of attenuation.

Step attenuator 220 may also be designed to have the following desirable characteristics:

1. High voltage handling capability,
2. Good linearity,
3. Broadband operation, and
4. Present a fixed capacitance at its input regardless of the amount of attenuation.

A step attenuator with constant input capacitance and good performance may be implemented in various manners. Constant input capacitance may be quantified by the input capacitance being within a predetermined range of values, or by a parameter such as S11 being within a predetermined range, or based on some other criteria. Some exemplary designs of such a step attenuator are described below.

Figure 3:
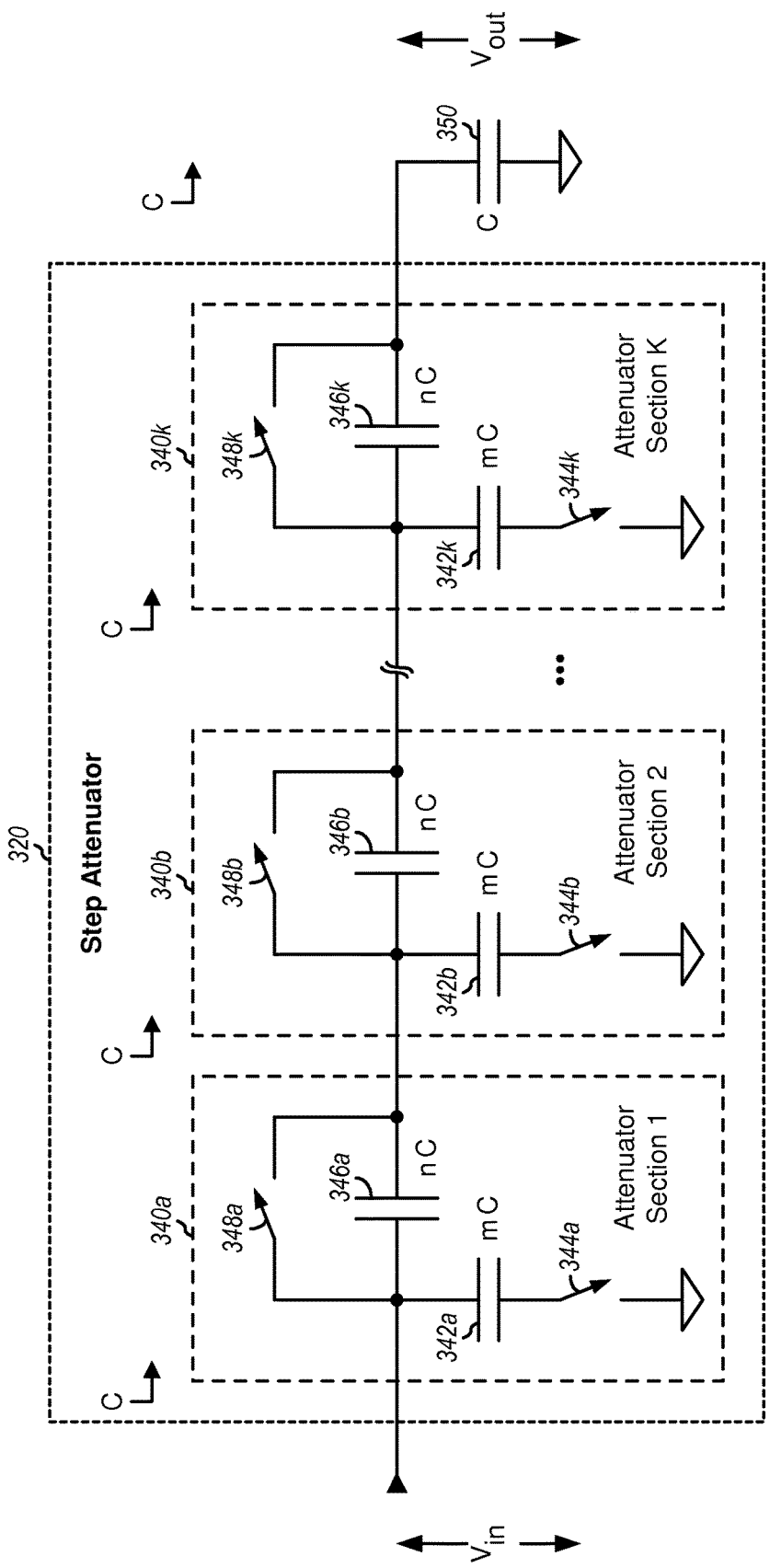
FIGS. 3 to 6 show four exemplary designs of a step attenuator with constant input capacitance.

FIG. 3 shows an exemplary design of a step attenuator 320 with constant input capacitance. Step attenuator 320 may be used for step attenuator 180 or 184 in FIG. 1 or step attenuator 220 in FIG. 2. In the design shown in FIG. 3, step attenuator 320 includes K attenuator sections 340a to 340k coupled in series, where K may be any integer value. Each attenuator section 340 includes (i) a series combination of a shunt capacitor 342 and a switch 344 and (ii) a parallel combination of a series capacitor 346 and a switch 348. Within the first attenuator section 340a, a capacitor 342a has one end coupled to the input of attenuator section 340a and the other end coupled to one end of a switch 344a. The other end of switch 344a is coupled to circuit ground. A capacitor 346a is coupled between the input and output of attenuator section 340a. A switch 348a is also coupled between the input and output of attenuator section 340a. Each of the remaining attenuator sections 340b to 340k may include capacitors 342 and 346 and switches 344 and 348, which may be coupled as described for the first attenuator section 340a.

Each attenuator section 340 within step attenuator 320 may be either selected/enabled or unselected/disabled at any given moment. Each attenuator section 340 may be selected by closing shunt switch 344 and opening series switch 348. This results in capacitor 342 being coupled between the input of the attenuator section and circuit ground and capacitor 344 being coupled between the input and output of the attenuator section. Each attenuator section 340 may be unselected by opening series switch 344 and closing shunt switch 348. This results in the input and output of the attenuator section being shorted and shunt capacitor 342 floating and not coupled to circuit ground.

As shown in FIG. 3, step attenuator 320 may observe a load capacitance of C from a capacitor 350, which may model the input capacitance of an RF power detector coupled to step attenuator 320. Step attenuator 320 may have an input capacitance of approximately C, which may be selected to match the load capacitance of step attenuator 320.

In one design, capacitance values of capacitors 342 and 346 in each attenuator section 340 may be selected to (i) provide a target amount attenuation when the attenuator section is selected and (ii) provide a fixed capacitance of C at the input of the attenuator section regardless of whether the attenuator section is selected or unselected. Characteristic (ii) may assume that each attenuator section 340 observes a load capacitance of C, which may correspond to the input capacitance of an RF power detector or the input capacitance of a following attenuator section 340. Characteristic (ii) may ensure that each attenuator section 340 can provide a load capacitance of C to a preceding attenuator section or an antenna tuning network.

In the design shown in FIG. 3, each attenuator section 340 may include shunt capacitor 342 having a capacitance of m·C and series capacitor 346 having a capacitance of n·C, where m denotes the size of shunt capacitor 342 and n denotes the size of series capacitor 346. Each attenuator section 340 may be designed to provide G decibels (dB) of attenuation. The capacitor sizes m and n of capacitors 342 and 346 in each attenuator section 340 may then be expressed as:

$$n = 10^{G/20} - 1, \text{ and} \qquad \text{Eq (1)}$$

$$m = \frac{1}{n+1}. \qquad \text{Eq (2)}$$

In the design shown in FIG. 3, the K attenuator sections 340a to 340k of step attenuator 320 provide the same amount of attenuation. In this design, the K attenuator sections 340a to 340k may have the same capacitor size of m·C for shunt capacitor 342 and also the same capacitor size of n·C for series capacitor 346.

Step attenuator 320 can provide different amounts of attenuation by selecting different numbers of attenuator sections 340. The smallest amount of attenuation may be obtained by selecting no attenuator sections. In this case, shunt capacitors 342a to 342k in all K attenuator sections 340a to 340k float, and series capacitors 346a to 346k in all K attenuator sections 340a to 340k are shorted. The largest amount of attenuation may be obtained by selecting all K attenuator sections 340a to 340k. In this case, shunt capacitors 342a to 342k in all K attenuator sections 340a to 340k are shorted to ground, and series capacitors 346a to 346k in all K attenuator sections 340a to 340k are connected between the input and output of step attenuator 320. Other amounts of attenuation may be obtained by selecting other combinations of attenuator sections 340.

Figure 4:
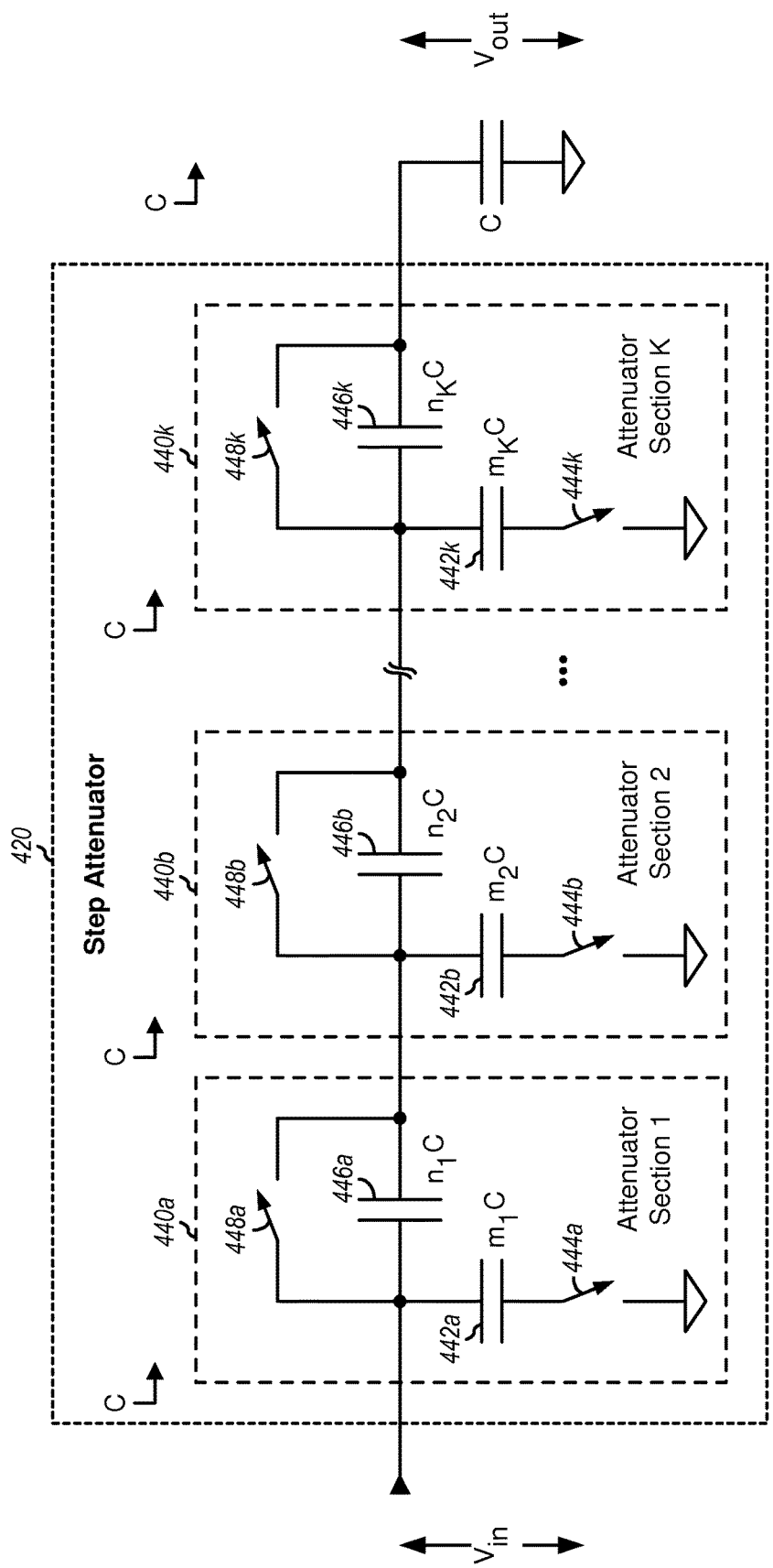

FIG. 4 shows an exemplary design of a step attenuator 420 with constant input capacitance. Step attenuator 420 may also be used for step attenuator 180 or 184 in FIG. 1 or step attenuator 220 in FIG. 2. In the design shown in FIG. 4, step attenuator 420 includes K attenuator sections 440a to 440k coupled in series, where K may be any integer value. Each attenuator section 440 includes (i) a series combination of a shunt capacitor 442 and a switch 444 and (ii) a parallel combination of a series capacitor 446 and a switch 448, which are coupled as described above for FIG. 3.

In the design shown in FIG. 4, shunt capacitor 442 in the k-th attenuator section, where k=1, . . . , K, may have a capacitance of $m_k \cdot C$, and series capacitor 446 in the k-th attenuator section may have a capacitance of $n_k \cdot C$, where $m_k$ denotes the size of shunt capacitor 442, and $n_k$ denotes the size of series capacitor 446 for the k-th attenuator section. The k-th attenuator section may be designed to provide $G_k$ dB of attenuation. The capacitor sizes $m_k$ and $n_k$ of capacitors 442 and 446 in the k-th attenuator section may be expressed as:

$$n_k = 10^{G_k/20} - 1, \text{ and} \quad \text{Eq (3)}$$

$$m_k = \frac{1}{n_k + 1}. \quad \text{Eq (4)}$$

In the design shown in FIG. 4, different attenuator sections 440 may provide different amounts of attenuation when these attenuator sections are selected. The K attenuator sections 440a to 440k may have different capacitance sizes for shunt capacitor 442 and also different capacitance sizes for series capacitor 446. The capacitor sizes $m_k$ and $n_k$ for each attenuator section may be determined based on the amount of attenuation $G_k$ provided by that attenuator section, e.g., as shown in equations (3) and (4).

Step attenuator 420 may provide different amounts of attenuation by selecting different numbers of attenuator sections 440 or different combinations of attenuator sections 440. The smallest amount of attenuation may be obtained by selecting no attenuator sections. In this case, shunt capacitors 442a to 442k in all K attenuator sections 440a to 440k float, and series capacitors 446a to 446k in all K attenuator sections 440a to 440k are shorted. The largest amount of attenuation may be obtained by selecting all K attenuator sections 440a to 440k. In this case, shunt capacitors 442a to 442k in all K attenuator sections 440a to 440k are shorted to ground, and series capacitors 446a to 446k in all K attenuator sections 440a to 440k are connected between the input and output of step attenuator 420. Other amounts of attenuation may be obtained by selecting other combinations of attenuator sections 440.

Figure 5:
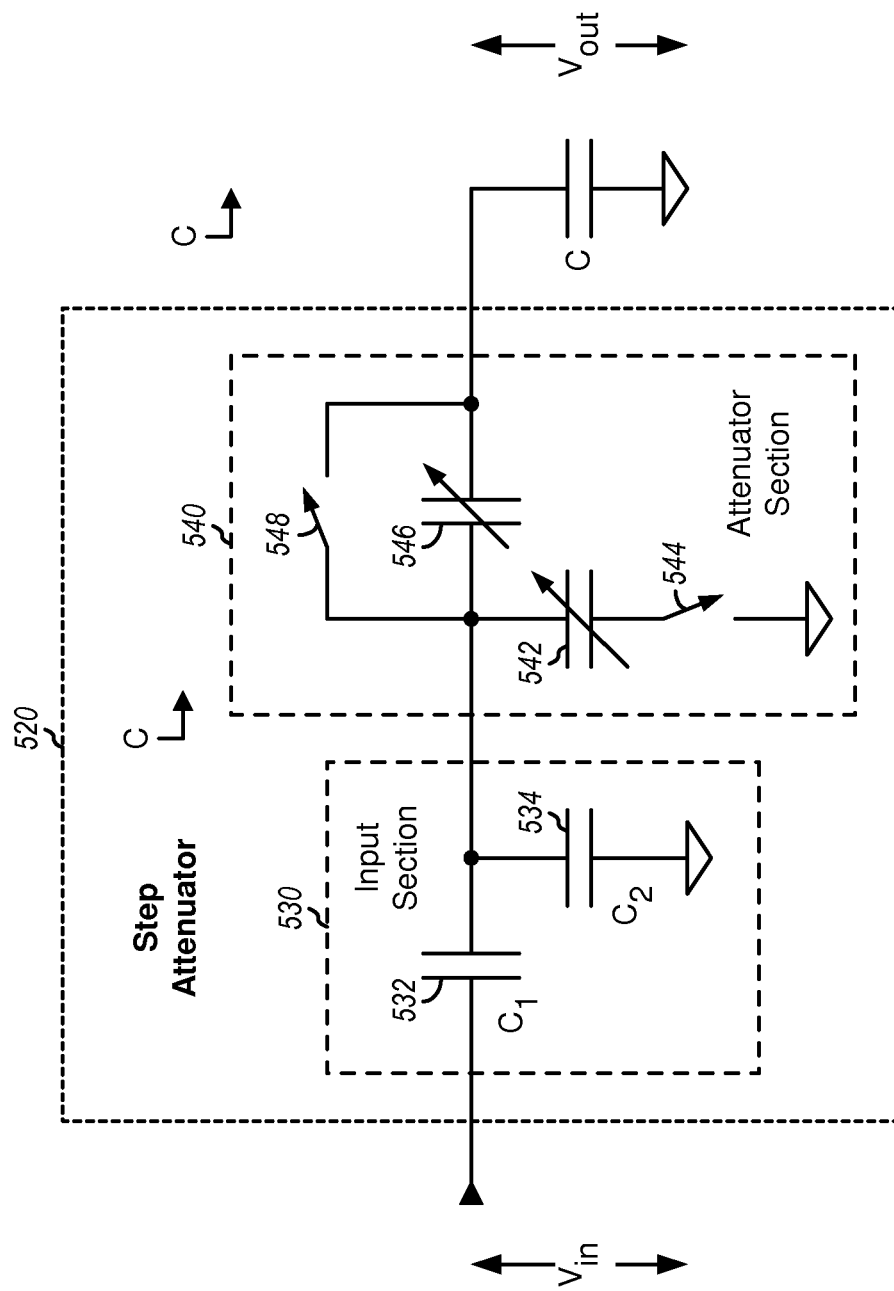

FIG. 5 shows an exemplary design of a step attenuator 520 with constant input capacitance. Step attenuator 520 may also be used for step attenuator 180 or 184 in FIG. 1 or step attenuator 220 in FIG. 2. In the design shown in FIG. 5, step attenuator 520 includes an input section 530 and a single attenuator section 540. Input section 530 includes capacitors 532 and 534 coupled as a voltage divider network. Capacitor 532 is coupled between an input and an output of input section 530. Capacitor 534 is coupled between the output of input section 530 and circuit ground. Attenuator section 540 includes (i) a series combination of a variable shunt capacitor 542 and a switch 544 and (ii) a parallel combination of a variable series capacitor 546 and a switch 548, which are coupled as described above for FIG. 3.

In one design, each variable capacitor 542 or 546 may be implemented with a bank of switchable capacitors. Each switchable capacitor may include a capacitor coupled in series with a switch. Each switchable capacitor may be selected by closing the switch and may be unselected by opening the switch. The switchable capacitors may have the same capacitance for thermometer decoding or different capacitances for binary or geometric weighting. A desired capacitance may be obtained for variable capacitor 542 or 546 by selecting an appropriate number of switchable capacitors or an appropriate combination of switchable capacitors.

In one design, variable shunt capacitor 542 may be set to one of a first set of L different capacitances of $m_1 \cdot C$ to $m_L \cdot C$, where L may be any integer value. Variable series capacitor 546 may also be set to one of a second set of L different capacitances of $n_1 \cdot C$ to $n_L \cdot C$. The i-th capacitance in the first set may be paired with the i-th capacitance in the second set. Hence, capacitance $m_i \cdot C$ in the first set may be paired with capacitance $n_i \cdot C$ in the second set, for i=1, . . . , L. L pairs of capacitances $\{m_1 \cdot C$ and $n_1 \cdot C\}$ to $\{m_L \cdot C$ and $n_L \cdot C\}$ may be obtained with the first and second sets of capacitances. In one design, the L pairs of capacitances may be associated with different amounts of attenuation of $G_1$ to $G_L$. The capacitances $m_i \cdot C$ and $n_i \cdot C$ in each pair may be determined as shown in equations (3) and (4) based on a target amount of attenuation $G_i$ for that pair, with $n_k$, $m_k$ and $x_k$ being replaced with $n_i$, $m_i$ and $x_i$, respectively.

Step attenuator 520 may provide different amounts of attenuation by selecting different pairs of capacitances for capacitors 542 and 546. The smallest amount of attenuation may be obtained by opening switch 544 and closing switch 548. In this case, shunt capacitor 442 floats, and series capacitor 446 is shorted. The largest amount of attenuation may be obtained by selecting the last capacitance pair with the smallest capacitance of $m_L \cdot C$ for capacitor 542 and the largest capacitance of $n_L \cdot C$ for capacitor 546. Other amounts of attenuation may be obtained by selecting other pairs of capacitances for capacitors 542 and 546.

Figure 6:
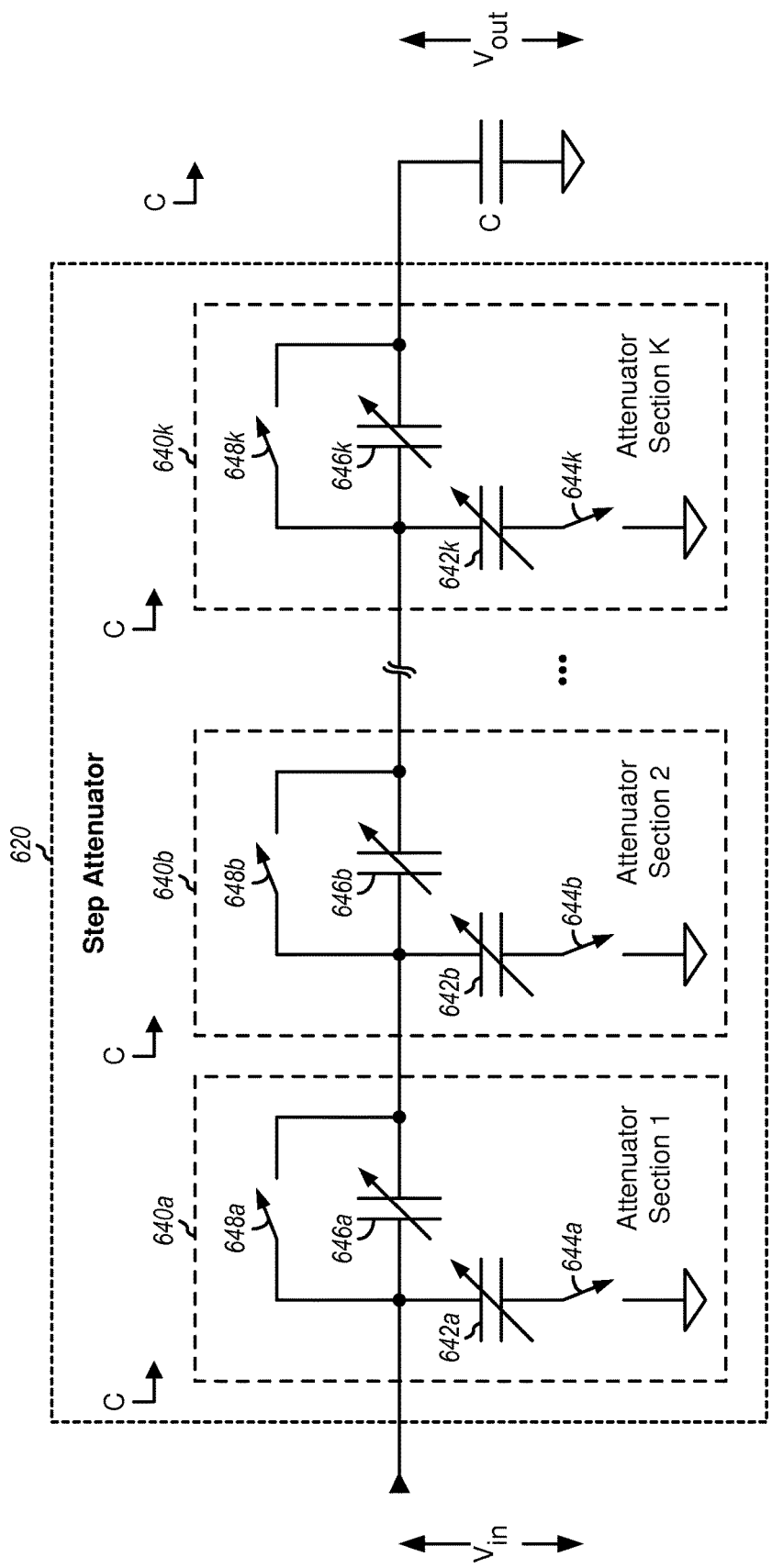

FIG. 6 shows an exemplary design of a step attenuator 620 with constant input capacitance. Step attenuator 620 may also be used for step attenuator 180 or 184 in FIG. 1 or step attenuator 220 in FIG. 2. In the design shown in FIG. 6, step attenuator 620 includes K attenuator sections 640a to 640k coupled in series, where K may be any integer value. Each attenuator section 640 includes (i) a series combination of a variable shunt capacitor 642 and a switch 644 and (ii) a parallel combination of a variable series capacitor 646 and a switch 648, which are coupled as described above for FIG. 3.

For each attenuator section 640, variable shunt capacitor 642 may be set to one of a first set of L different capacitances of $m_1 \cdot C$ to $m_L \cdot C$, where L may be any integer value. Variable series capacitor 646 may also be set to one of a second set of L different capacitances of $n_1 \cdot C$ to $n_L \cdot C$. The i-th capacitance in the first set may be paired with the i-th capacitance in the second set. Capacitances $m_i \cdot C$ and $n_i \cdot C$ in each pair may be determined as shown in equations (3) and (4) based on a target amount of attenuation $G_i$ for that pair, with $n_k$, $m_k$ and $x_k$ being replaced with $n_i$, $m_i$ and $x_i$, respectively. The L pairs of capacitances may be associated with different amounts of attenuation of $G_1$ to $G_L$ for the attenuator section.

In one design, variable shunt capacitor 642 in all K attenuator sections 640 may be associated with the same first set of capacitances. Variable series capacitor 646 in all K attenuator sections 640 may also be associated with the same second set of capacitances. In this design, all K attenuator sections 640 may provide the same set of K different amounts of attenuation. Each attenuator section 640 may be set to one of the set of K different amounts of attenuation.

In another design, variable shunt capacitor 642 in different attenuator sections 640 may be associated with different first sets of capacitances. Variable series capacitor 646 in different attenuator sections 640 may also be associated with different second sets of capacitances. In this design, each attenuator section 640 may be set to one of a set of K different amounts of attenuation for that attenuator section.

Step attenuator 620 may provide different amounts of attenuation by selecting different numbers of attenuator sections 640, or different combinations of attenuator sections 640, and/or different capacitances for capacitors 642 and 646 in each selected attenuator section 640. In one design, each attenuator section may be selected or unselected to provide a coarse change in attenuation. The capacitors within each selected attenuator section may be varied to provide a fine change in attenuation. The smallest amount of attenuation may be obtained by selecting no attenuator sections. In this case, shunt capacitors 642a to 642k in all K attenuator sections 640a to 640k float, and series capacitors 646a to 646k in all K attenuator sections 640a to 640k are shorted. The largest amount of attenuation may be obtained by selecting the last capacitance pair associated with the largest amount of attenuation in all K attenuator sections 640a to 640k. Other amounts of attenuation may be obtained by selecting other combinations of attenuator sections 640 and/or other capacitance pairs for each selected attenuator section 640.

FIGS. 3 to 6 show four exemplary designs of a step attenuator with constant input capacitance. In general, a step attenuator with constant input capacitance may include any number of attenuator sections. Each attenuator section may include (i) a shunt capacitor coupled between an input of the attenuator section and circuit ground and (ii) a series capacitor coupled between the input and output of the attenuator section. Each attenuator section may also include a first switch coupled in series with the shunt capacitor and a second switch coupled in parallel with the series capacitor. Each capacitor may have a fixed capacitance or a variable capacitance. The capacitances of the shunt capacitor and series capacitor may be selected to obtain a desired amount of attenuation and to maintain approximately constant input capacitance regardless of whether the attenuator section is selected or unselected.

A step attenuator may include multiple attenuator sections, e.g., as shown in FIGS. 3, 4 and 6. In this case, different attenuator sections may have the same capacitances m·C and n·C and may provide the same amount of attenuation when selected, e.g., as shown in FIG. 3. Alternatively, different attenuator sections may have different capacitances $m_k \cdot C$ and $n_k \cdot C$ and may provide different amounts of attenuation when selected, e.g., as shown in FIG. 4. The attenuator sections may include fixed capacitors (e.g., as shown in FIGS. 3 and 4) or variable capacitors (e.g., as shown in FIG. 6). The step attenuator may also include one or more attenuator sections with fixed capacitors and one or more additional attenuator sections with variable capacitors.

In the exemplary designs shown in FIGS. 3 to 6, each attenuator section is implemented based on an "R" circuit topology and includes (i) a shunt capacitor between an input of the attenuator section and circuit ground and (ii) a series capacitor between the input and output of the attenuator section. Each attenuator section may also be implemented based on other circuit topologies. In another exemplary design, each attenuator section may be implemented based on a "T" circuit topology and includes (i) a first capacitor between an input of the attenuator section and an intermediate node, (ii) a second capacitor between the intermediate node and an output of the attenuator section, and (iii) a third capacitor between the intermediate node and circuit ground. In yet another exemplary design, each attenuator section may be implemented based on a "Pi" circuit topology and includes (i) a first capacitor between an input of the attenuator section and circuit ground, (ii) a second capacitor between the input and output of the attenuator section, and (iii) a third capacitor between the output of the attenuator section and circuit ground. Each attenuator section may also include different and/or other circuit components.

In the exemplary designs shown in FIGS. 3 to 6, each attenuator section may include switches used to select or unselect the attenuator section. The switches may be used to (i) simply pass the input signal through the attenuator section and provide no attenuation (i.e., an attenuation of 0 dB) or (ii) attenuate the input signal via the capacitors in the attenuator section.

In another design, an attenuator section may always be selected to provide a fixed or a variable amount of attenuation. The always-selected attenuator section may include no switches and may have its shunt capacitor coupled directly to circuit ground (instead of via a shunt switch). The attenuator section may include a fixed series capacitor and a fixed shunt capacitor having fixed capacitances and may provide a predetermined amount of attenuation. Alternatively, the attenuator section may include a variable series capacitor and a variable shunt capacitor having adjustable capacitances and may provide a variable amount of attenuation. In either case, the attenuator section may provide a certain minimum amount of attenuation. A step attenuator may include one or more always-selected attenuator sections and may then provide a certain minimum amount of attenuation.

FIGS. 3 to 6 show exemplary designs of a step attenuator implemented with capacitors. A step attenuator may also be implemented with circuit components of other types. For example, a step attenuator may be implemented with resistors, or inductors, or other circuit components, e.g., instead of capacitors or in addition to capacitors.

Switches within a step attenuator may be implemented in various manners. For example, the switches may be implemented with N-channel metal oxide semiconductor (NMOS) transistors, or P-channel metal oxide semiconductor (PMOS) transistors, or both NMOS and PMOS transistors, or transistors of other types. A switch may be implemented with a single transistor. A switch may also be implemented with multiple transistors coupled in a stack in order to handle a signal with a large voltage swing. Each transistor in the stack may observe only a fraction of the voltage swing and may be able to operate within its specified voltage limits. Switches may also be implemented with micro-electromechanical system (MEMS) structures, diodes, and/or other circuit components.

An RF power detector may receive an input RF signal from a step attenuator and may provide an envelope signal indicative of the power of the input RF signal. The RF power detector may be associated with a power detector gain, which may be a conversion gain between the envelope signal and the input RF signal. The power detector gain should vary as little as possible over temperature in order to provide accurate power measurements of the input RF signal. An exemplary design of an RF power detector with temperature compensation and having reduced variations in power detector gain and improved accuracy over temperature is described below.

Figure 7:
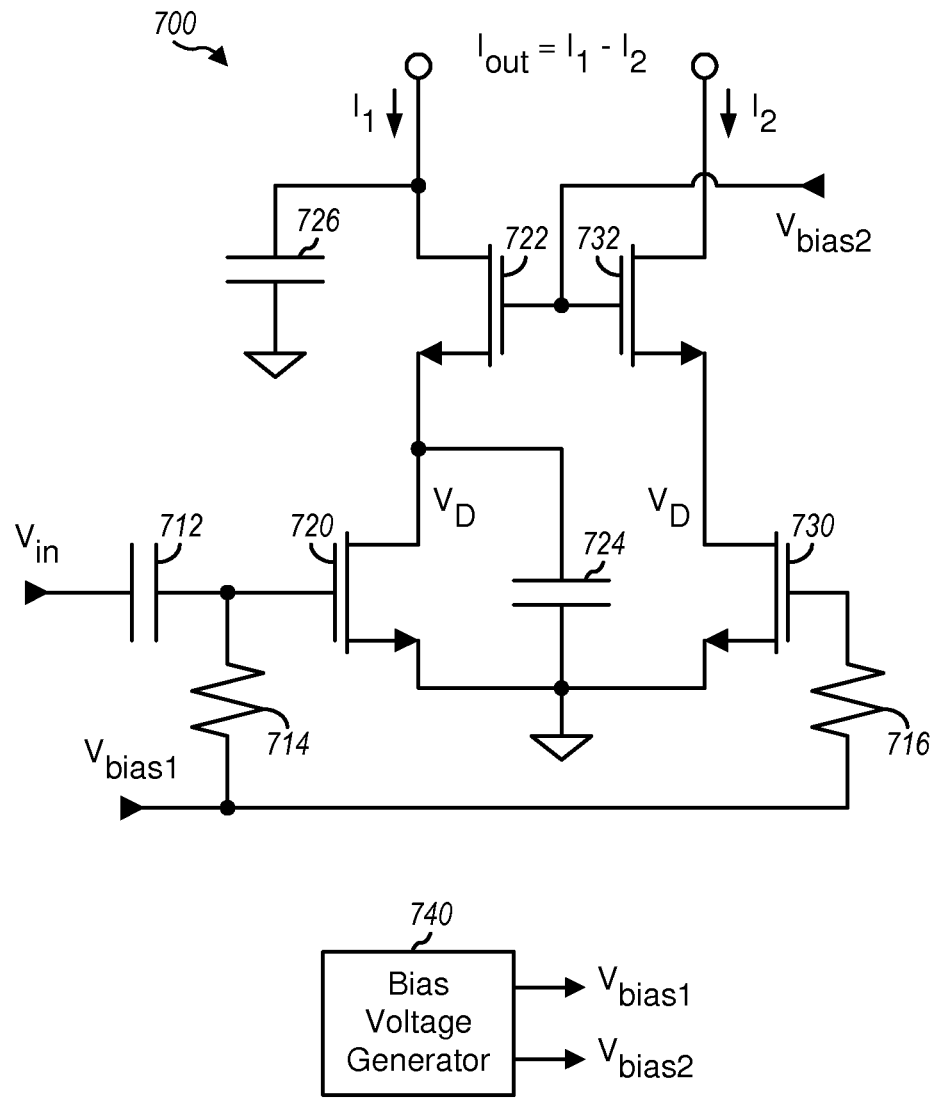
FIG. 7 shows a schematic diagram of an RF power detector.

FIG. 7 shows a schematic diagram of an exemplary design of an RF power detector 700 with temperature compensation. RF power detector 700 may be used for power detector 182 or 186 in FIG. 1 or RF power detector 240 in FIG. 2. RF power detector 700 includes two gain NMOS transistors 720 and 730 coupled as a differential pair. NMOS transistor 720 has its source coupled to circuit ground, its gate coupled to one end of a resistor 714, and its drain coupled to the source of a cascode MOS transistor 722. NMOS transistor 730 has its source coupled to circuit ground, its gate coupled to one end of a resistor 716, and its drain coupled to the source of a cascode NMOS transistor 732. The other ends of resistors 714 and 716 are coupled together and are applied a first gate bias voltage ($V_{bias1}$). NMOS transistor 722 has its gate receiving a second bias voltage ($V_{bias2}$) and its drain providing a first output current ($I_1$). NMOS transistor 732 has its gate receiving the $V_{bias2}$ voltage and its drain providing a second output current ($I_2$). An AC coupling capacitor 712 has one end receiving an input RF signal ($V_{in}$) and the other end coupled to the gate of NMOS transistor 720. A capacitor 724 is coupled between the drain of NMOS transistor 720 and circuit ground. A capacitor 726 is coupled between the drain of NMOS transistor 722 and circuit ground. A bias voltage generator 740 generates the $V_{bias1}$ voltage for NMOS transistors 720 and 730 and the $V_{bias2}$ voltage for NMOS transistors 722 and 732.

Power detector 700 receives the $V_{in}$ signal at the gate of NMOS transistor 720 and provides a differential output current ($I_{out}$) from the drains of NMOS transistors 722 and 732. A transfer function between the $I_{out}$ current and the square of the $V_{in}$ signal ($V_{in}^2$) include various terms that may be dependent on temperature. The $V_{bias1}$ and $V_{bias2}$ voltages may be generated such that the power detector gain changes as little as possible over temperature. Suitable $V_{bias1}$ and $V_{bias2}$ voltages for a desired power detector gain may be determined based on computer simulation, empirical measurement, etc.

In an exemplary design, the $V_{bias1}$ voltage may be generated to decrease with temperature or complementary to absolute temperature (CTAT). In an exemplary design, the $V_{bias2}$ voltage may be generated to increase with temperature or proportional to absolute temperature (PTAT). In an exemplary design, the $V_{bias1}$ and $V_{bias2}$ voltages may be generated such that the bias current through each of NMOS transistors 720 and 730 is maintained within a particular range. Limiting variations of the bias current may avoid possible issues related to voltage clipping and linearity of power detector 700.

Power detector 700 in FIG. 7 may have various advantages such as wideband operation (e.g., from 500 MHz to 2.7 GHz in one exemplary design), wide dynamic range, and low current consumption. The power detector gain of power detector 700 may vary over IC process, power supply voltage, and temperature (PVT), especially over temperature. Power detector 700 may be compensated based on the variable $V_{bias1}$ and $V_{bias2}$ voltages in order to reduce variations of the power detector gain over temperature.

In an exemplary design, an apparatus (e.g., a wireless device, an IC, a circuit module, etc.) may include a step attenuator having a constant input capacitance for different amounts of attenuation. The step attenuator (e.g., step attenuator 220, 320, 420, 520 or 620 in FIG. 2, 3, 4, 5 or 6, respectively) may receive an input signal, provide a variable amount of attenuation for the input signal, and provide an output signal. The apparatus may further include a power detector coupled to the step attenuator. The power detector (e.g., power detector 240 or 700 in FIG. 2 or 7, respectively) may receive the output signal and determine the power of the output signal.

In an exemplary design, the step attenuator may include a plurality of attenuator sections coupled in series, e.g., as shown in FIG. 3, 4 or 6. Each attenuator section may include a plurality of capacitors and may have the constant input capacitance. At least one of the plurality of attenuator sections may be selected or unselected to obtain a selected amount of attenuation for the step attenuator.

In one design, each attenuator section may include a shunt capacitor, a series capacitor, and first and second switches. The shunt capacitor and the first switch (e.g., capacitor 342a and switch 344a in FIG. 3) may be coupled in series and between an input of the attenuator section and circuit ground. The series capacitor and the second switch (e.g., capacitor 346a and switch 348a in FIG. 3) may be coupled in parallel and between the input and output of the attenuator section.

Each attenuator section may include the shunt capacitor having a first capacitance value and the series capacitor having a second capacitance value. In one design, the first and second capacitance values may be fixed values (e.g., as shown in FIG. 3 or 4). The fixed values may be selected to obtain the constant input capacitance as well as a target amount of attenuation for the attenuator section. In one design, the plurality of attenuator sections may include a plurality of shunt capacitors having same first capacitance value and a plurality of series capacitors having same second capacitance value (e.g., as shown in FIG. 3). In another design, the plurality of attenuator sections may include a plurality of shunt capacitors having different first capacitance values and a plurality of series capacitors having different second capacitance values (e.g., as shown in FIG. 4).

In another design, the plurality of attenuator sections may include at least one adjustable attenuator section (e.g., as shown in FIG. 6). Each adjustable attenuator section may include a variable shunt capacitor, a variable series capacitor, and first and second switches. The variable shunt capacitor and the first switch (e.g., capacitor 642a and switch 644a in FIG. 6) may be coupled in series and between an input of the adjustable attenuator section and circuit ground. The variable series capacitor and the second switch (e.g., capacitor 646a and switch 648a in FIG. 6) may be coupled in parallel and between the input and output of the adjustable attenuator section. The variable shunt capacitor may be set to one of a first set of capacitance values. The variable series capacitor may be set to one of a second set of capacitance values. Each capacitance value in the first set may be paired with one capacitance value in the second set. Each adjustable attenuator section may support a plurality of different amounts of attenuation, which may be determined by a plurality of pairs of capacitance values formed with the first set of capacitance values for the variable shunt capacitor and the second set of capacitance values for the variable series capacitor.

Each attenuator section may be implemented based on the "R" circuit topology, e.g., as shown in FIGS. 3 to 6. Each attenuator section may also be implemented based on the "T" circuit topology, or the "Pi" circuit topology, or some other circuit topology.

In general, each attenuator section of the step attenuator may be a fixed attenuator section, or an adjustable attenuator section, or an always-selected attenuator section. A fixed attenuator section may provide a predetermined amount of attenuation when selected (e.g., as shown in FIGS. 3 and 4). An adjustable attenuator section may provide one of a plurality of different amounts of attenuation when selected (e.g., as shown in FIG. 6). An always-selected attenuator section may always be selected to provide a fixed or a variable amount of attenuation.

In one design, each of the plurality of attenuator sections may be a fixed attenuator section (e.g., as shown in FIGS. 3 and 4). In another design, each of the plurality of attenuator sections may be an adjustable attenuator section (e.g., as shown in FIG. 6). In yet another design, the plurality of attenuator sections may include at least one fixed attenuator section and at least one adjustable attenuator section. In another design, the plurality of attenuator sections may include at least one always-selected attenuator section.

In another design, the step attenuator may include a single attenuator section (e.g., as shown in FIG. 5). This attenuator section may include a variable shunt capacitor, a variable series capacitor, and first and second switches. The variable shunt capacitor and the first switch (e.g., capacitor 542 and switch 544) may be coupled in series and between an input of the attenuator section and circuit ground. The variable series capacitor and the second switch (e.g., capacitor 546 and switch 548) may be coupled in parallel and between the input and output of the attenuator section.

In one design, the step attenuator may include an input section providing a fixed amount of attenuation. The input section (e.g., input section 530 in FIG. 5) may include at least two capacitors coupled as a voltage divider network.

Figure 8:
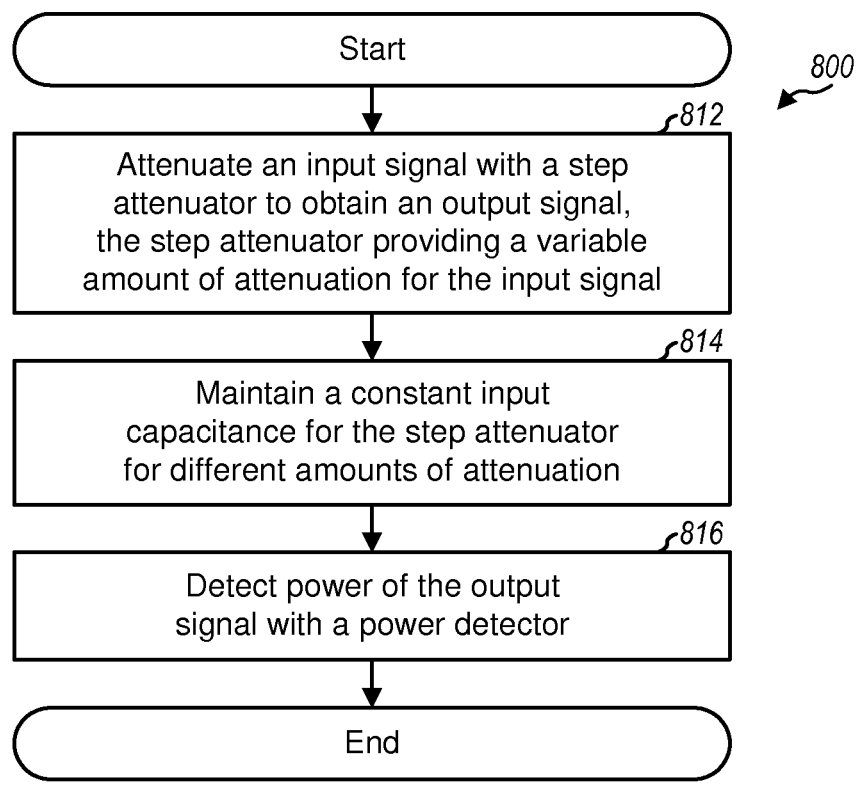
FIG. 8 shows a process for performing signal attenuation and power detection.

FIG. 8 shows an exemplary design of a process 800 for performing signal attenuation and power detection. An input signal may be attenuated with a step attenuator to obtain an output signal (block 812). The step attenuator may provide a variable amount of attenuation for the input signal. A constant input capacitance may be maintained for the step attenuator for different amounts of attenuation (block 814). The power of the output signal may be detected with a power detector (block 816).

In one design, the step attenuator may include a plurality of attenuator sections. Each attenuator section may comprise a plurality of capacitors and may have the constant input capacitance. At least one of the plurality of attenuator sections may be selected to obtain a selected amount of attenuation of the input signal. In one design, the at least one attenuator section may include an adjustable attenuator section comprising a variable shunt capacitor and a variable series capacitor. One of a first set of capacitance values may be selected for the variable shunt capacitor and one of a second set of capacitance values may be selected for the variable series capacitor to obtain the selected amount of attenuation of the input signal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
a step attenuator configured to receive an input signal, provide a variable amount of attenuation for the input signal, and provide an output signal, the step attenuator having a constant input capacitance for different amounts of attenuation, the step attenuator including a plurality of attenuator sections with at least one attenuator section in the plurality of attenuator sections comprising:
a first node;
a second node;
only one shunt capacitor and only one first switch connected in series, a first terminal of the shunt capacitor being connected to the first node, a second terminal of the shunt capacitor being connected to a first terminal of the first switch, and a second terminal of the first switch being coupled to circuit ground; and
only one series capacitor and only one second switch connected in parallel, a first terminal of the series capacitor and a first terminal of the second switch being connected to the first node, and a second terminal of the series capacitor and a second terminal of the second switch being connected to the second node.

2. The apparatus of claim 1, further comprising:
a power detector coupled to the step attenuator and configured to receive the output signal and determine power of the output signal.

3. The apparatus of claim 1, the step attenuator comprising:
an input section comprising at least two capacitors coupled as a voltage divider network, the input section providing a fixed amount of attenuation.

4. The apparatus of claim 1, wherein the step attenuator is further configured to select the at least one attenuator section by closing the first switch and opening the second switch.

5. The apparatus of claim 1, wherein the plurality of attenuator sections are coupled in series, each attenuator section comprising a plurality of capacitors and having the constant input capacitance, the at least one attenuator section being selected or unselected to obtain a selected amount of attenuation for the step attenuator.

6. The apparatus of claim 5, the plurality of attenuator sections comprising at least one first attenuator section and at least one second attenuator section, each first attenuator section providing a predetermined amount of attenuation when selected, each second attenuator section providing one of a plurality of different amounts of attenuation when selected.

7. The apparatus of claim 5, wherein the at least one attenuator section is configured to always provide a fixed or a variable amount of attenuation.

8. The apparatus of claim 5, wherein the at least one attenuator section comprises at least one adjustable attenuator section, wherein the shunt capacitor comprises a variable shunt capacitor, and wherein the series capacitor comprises a variable series capacitor.

9. The apparatus of claim 8, wherein the variable shunt capacitor is set to one of a first set of capacitance values and the variable series capacitor is set to one of a second set of capacitance values, each capacitance value in the first set being paired with one capacitance value in the second set.

10. The apparatus of claim 9, each adjustable attenuator section supporting a plurality of different amounts of attenuation determined by a plurality of pairs of capacitance values formed with the first set of capacitance values for the variable shunt capacitor and the second set of capacitance values for the variable series capacitor.

11. The apparatus of claim 5, wherein each attenuator section comprises a shunt capacitor having a first capacitance value and a series capacitor having a second capacitance value, the first and second capacitance values being fixed values and selected to obtain the constant input capacitance and a target amount of attenuation for each attenuator section.

12. The apparatus of claim 11, the plurality of attenuator sections including a plurality of shunt capacitors having same first capacitance value and a plurality of series capacitors having same second capacitance value.

13. The apparatus of claim 11, the plurality of attenuator sections including a plurality of shunt capacitors having different first capacitance values and a plurality of series capacitors having different second capacitance values.

14. An apparatus comprising:
a step attenuator configured to receive an input signal, provide a variable amount of attenuation for the input signal, and provide an output signal, the step attenuator having a constant input capacitance for different amounts of attenuation, the step attenuator including a plurality of attenuator sections with at least one attenuator section in the plurality of attenuator sections comprising:
a first node;
a second node;
a shunt capacitor and a first switch connected in series, a first terminal of the shunt capacitor being connected to the first node, a second terminal of the shunt capacitor being connected to a first terminal of the first switch, and a second terminal of the first switch being coupled to circuit ground; and
a series capacitor and a second switch connected in parallel, a first terminal of the series capacitor and a first terminal of the second switch being connected to the first node, and a second terminal of the series capacitor and a second terminal of the second switch being connected to the second node; and
a power detector coupled to the step attenuator and configured to receive the output signal and determine power of the output signal,
wherein the output signal comprises a radio frequency (RF) signal and the power detector comprises an RF power detector configured to detect the power of the RF output signal.

15. The apparatus of claim 14, wherein the RF power detector is directly connected to the step attenuator.

16. An apparatus comprising:
means for attenuating an input signal to obtain an output signal, the means for attenuating providing a variable amount of attenuation for the input signal and having a constant input capacitance for different amounts of attenuation, the means for attenuating including at least one attenuator section comprising:
first and second means for connecting with the at least one attenuator section;
only one shunt capacitor coupled to the first means for connecting;
only one series capacitor coupled between the first and second means for connecting;
means for selectively coupling the shunt capacitor in series with circuit ground; and
means for selectively shorting the series capacitor.

17. The apparatus of claim 16, further comprising:
means for detecting power of the output signal.

18. The apparatus of claim 16, further comprising:
means for selecting at least one of a plurality of attenuator sections of the means for attenuating to obtain a selected amount of attenuation of the input signal, each attenuator section having the constant input capacitance.

19. The apparatus of claim 16, wherein the shunt capacitor comprises a variable shunt capacitor and wherein the series capacitor comprises a variable series capacitor, the apparatus further comprising:
   means for selecting one of a first set of capacitance values for the variable shunt capacitor to obtain the selected amount of attenuation of the input signal; and
   means for selecting one of a second set of capacitance values for the variable series capacitor to obtain the selected amount of attenuation of the input signal.

20. The apparatus of claim 16, wherein the means for attenuating is further configured to select the at least one attenuator section by closing the means for selectively coupling and opening the means for selectively shorting.

* * * * *